(12) United States Patent
Kenny et al.

(10) Patent No.: US 6,372,521 B1
(45) Date of Patent: *Apr. 16, 2002

(54) POST EPITAXIAL THERMAL OXIDATION

(75) Inventors: Danny Kenny; Keith Lindberg, both of Sherman, TX (US)

(73) Assignee: GlobiTech Incorporated, Sherman, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,253

(22) Filed: Jan. 19, 1999

Related U.S. Application Data
(60) Provisional application No. 08/072,046, filed on Jan. 21, 1998.

(51) Int. Cl.[7] .................................................. H01L 21/00
(52) U.S. Cl. ............................ 438/4; 438/478; 438/974
(58) Field of Search ............................ 438/4, 478, 974, 438/442

(56) References Cited

U.S. PATENT DOCUMENTS 3,559,281 A * 2/1971 Mayberry et al. ............. 29/575
5,130,268 A * 7/1992 Liou et al. ..................... 437/67

FOREIGN PATENT DOCUMENTS

JP          53-110459          * 9/1978

* cited by examiner

Primary Examiner—Richard Elms
Assistant Examiner—Bradley Smith
(74) Attorney, Agent, or Firm—Jones, Day, Reavis & Pogue

(57) ABSTRACT

A system and method for handling post epitaxial thermal oxidation. The method produces semiconductor wafers by performing the steps of forming a wafer substrate, depositing an epilayer on the substrate, oxidizing a top portion of the epilayer, and removing the oxidized top portion. As a result, the wafer's surface is very smooth, with little or no micro-steps thereon.

2 Claims, 1 Drawing Sheet

POST EPITAXIAL THERMAL OXIDATION

CROSS REFERENCE TO RELATED APPLICATIONS

This application relies on U.S. Provisional Patent Application No. 60/072,046, entitled "Post Expitaxial Thermal Oxidation," filed Jan. 21, 1998.

TECHNICAL FIELD

This invention relates generally to semiconductor wafer production.

BACKGROUND OF THE INVENTION

In general, semiconductor wafers are prepared in several steps, including (1) growing a single crystal ingot out of molten silicon, (2) sawing the single crystal ingot into wafers, (3) shaping or lapping the wafers, (4) performing a rough polish, and (5) depositing an epi layer of silicon substrate. The epi layer is often deposited using chemical vapor, high temperature deposition to form a single crystal silicon layer on the surface of the wafer. Once the wafers have been prepared, they are provided to a fabrication facility (fab) for further processing.

As fabs are processing smaller and smaller line widths and devices are continually shrinking, the wafer surface effects the entire fab processing. Furthermore, a particle that used to be "invisible" can now completely ruin a device. Also, the surface of an epitaxial wafer exhibits characteristics known as "micro-steps." Micro-steps occur because the surface of the wafer is crystal and when it is sawed, the surface is dis-oriented with respect to the crystal graphic plains. Therefore, despite the wafers being sawn and polished, the resulting surface has these micro-steps across its surface.

SUMMARY OF THE INVENTION

In response to the problems discussed above, described herein is a system and method for handling post epitaxial thermal oxidation. In one embodiment, the method produces semiconductor wafers by performing the steps of forming a wafer substrate, depositing an epilayer on the substrate, oxidizing a top portion of the epilayer, and removing the oxidized top portion. As a result, the wafer include's an epi-surface that is very smooth, with little or no micro-steps thereon.

DESCRIPTION OF THE PREFERRED EMBODIMENT

Figure 1A:
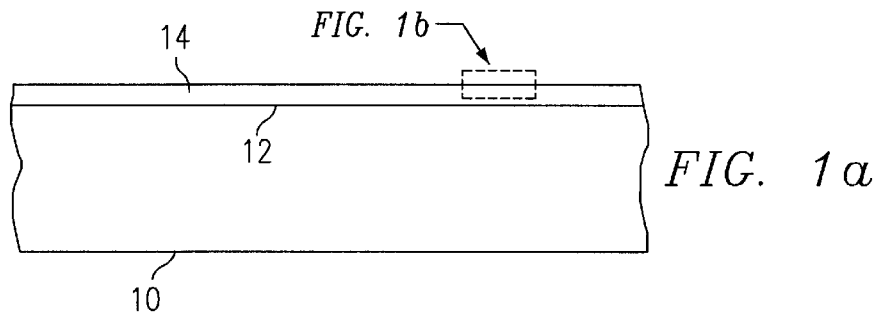
FIGS. 1a, 1b are cross sectional views of a wafer with an epitaxial layer deposited thereon.
Figure 1B:
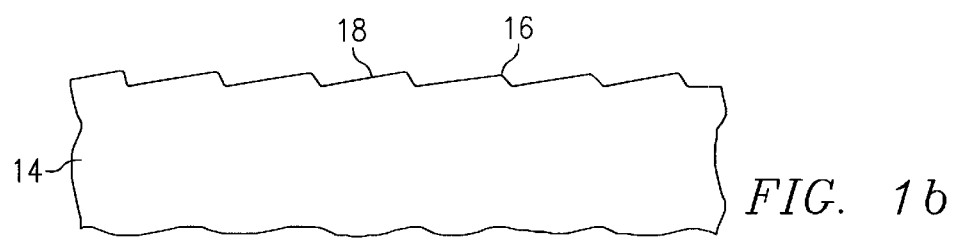

Referring to FIG. 1a, a semiconductor wafer substrate 10 has deposited on its top surface 12 an epitaxial layer 14. Fabricating an epitaxial layer on a wafer is well known in the art and will not be further discussed. However, referring to FIG. 1b, it becomes evident that small micro steps 16 are formed on a top surface 18 of the epilayer 14.

Figure 2:
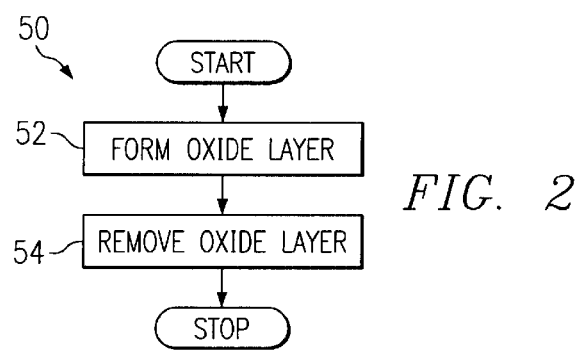
FIG. 2 is a flowchart of a method to be performed on the wafer of FIG. 1.
Figure 3:
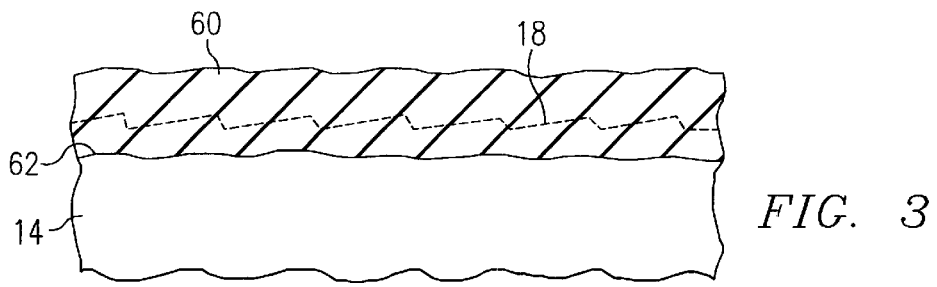
FIG. 3 is a cross sectional view of the wafer of FIGS. 1a, 1b with an oxide layer on a top surface thereof.

Referring to FIGS. 2 and 3, a method 50 is used to reduce the size of the micro steps 16 (as well as remove any particles) from the top surface 18 of the epilayer 14. At step 52, an oxidation layer 60 is deposited or grown on the epilayer 14 using thermal oxidation. During this step 52, a portion of the epilayer (silicon) is consumed by the oxygen. As a result, the previous epi-surface 18 no longer exists and a new, smoother epi/oxide interface 62 is formed. At step 54, the oxide layer 60, including the consumed silicon that previously existed between the epi-surface 18 and the epi/oxide interface 62, is removed.

Figure 4:
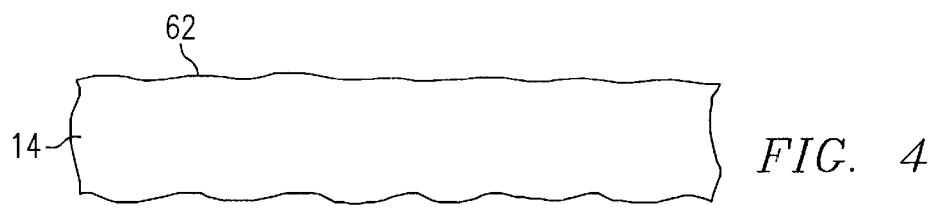
FIG. 4 is a cross sectional view of the wafer of FIG. 2 after the oxide layer has been removed.

Referring to FIG. 4, as a result, a resultant epi-surface 64 is formed on the epilayer 14. The epi-surface 64 is relatively smooth, as compared with the epi-surface 18.

What is claimed is:

1. A method for reducing the size of microsteps on an epitaxial layer deposited on a polished semiconductor wafer substrate comprising:
    sawing semiconductor wafer;
    polishing the surface of said semiconductor wafer;
    depositing an epilayer on said polished surface of said semiconductor wafer, wherein microsteps are formed on the exposed surface of said epilayer;
    thermal oxidizing a top portion of the epitaxial layer including said exposed surface defining said microsteps and thereby forming a boundary surface between said deposited epitaxial layer and said oxidized top portion of said epitaxial layer said boundary layer relatively smoother than said exposed surface of said deposited epitaxial layer; and
    removing the oxidized top portion of said epitaxial layer so as to remove said microsteps and leave said relatively smoother boundary surface as the exposed top surface of the epitaxial layer.

2. A method for producing a smooth surface for an epitaxial layer on a semiconductor wafer after the epitaxial layer is deposited thereon the epitaxial layer defining a plurality of microsteps on the exposed surface thereof subsequent to being deposited the method comprising:
    thermal oxidizing a top portion of the epitaxial layer including the exposed surface defining said plurality of microsteps and thereby forming a boundary surface between said deposited epitaxial layer and said oxidized top portion of said epitaxial layer relatively smoother than said exposed surface of said deposited epitaxial layer; and
    removing the oxidized top portion of said epitaxial layer so as to leave said relatively smoother boundary surface as the exposed top surface of the epitaxial layer thereby eliminating the microsteps.

* * * * *